US011513419B2

(12) United States Patent
Kippenberg et al.

(10) Patent No.: US 11,513,419 B2
(45) Date of Patent: Nov. 29, 2022

(54) GENERATING OPTICAL PULSES VIA A SOLITON STATE OF AN OPTICAL MICRORESONATOR COUPLED WITH A CHIP BASED SEMICONDUCTOR LASER

(71) Applicant: ECOLE POLYTECHNIQUE FEDERALE DE LAUSANNE (EPFL), Lausanne (CH)

(72) Inventors: Tobias Kippenberg, Lausanne (CH); Michael L. Gorodetsky, Moscow (RU); Arslan Sajid Raja, Echandens-Denges (CH); Hairun Guo, Lausanne (CH)

(73) Assignee: Ecole Polytechnique Federale de Lausanne (EPFL), Lausanne (CH)

( * ) Notice: Subject to any disclaimer, the term of this patent is extended or adjusted under 35 U.S.C. 154(b) by 0 days.

(21) Appl. No.: 17/276,589

(22) PCT Filed: Sep. 17, 2018

(86) PCT No.: PCT/EP2018/075020
§ 371 (c)(1),
(2) Date: Mar. 16, 2021

(87) PCT Pub. No.: WO2020/057716
PCT Pub. Date: Mar. 26, 2020

(65) Prior Publication Data
US 2022/0050356 A1   Feb. 17, 2022

(51) Int. Cl.
*G02F 1/35* (2006.01)
*G02F 1/365* (2006.01)
(Continued)

(52) U.S. Cl.
CPC ............ *G02F 1/3513* (2013.01); *G02F 1/365* (2013.01); *H01S 5/0092* (2013.01);
(Continued)

(58) Field of Classification Search
CPC ...... G02F 1/3513; G02F 1/3536; G02F 1/365; G02F 2203/56; H01S 5/0092; H01S 5/0656
See application file for complete search history.

(56) References Cited

U.S. PATENT DOCUMENTS

| 2016/0011489 A1* | 1/2016 | Herr ................... G02B 6/29338 385/2 |
| 2018/0083599 A1* | 3/2018 | Kippenberg ............ H04J 14/06 |

(Continued)

FOREIGN PATENT DOCUMENTS

| WO | WO 2014/131425 | 9/2014 |
| WO | WO-2014197780 A1 * | 12/2014 ............. H03B 17/00 |

OTHER PUBLICATIONS

T. Herr et al., "Soliton mode-locking in optical microresonators," in CLEO: 2013, OSA Technical Digest, 2 pages, Paper QTh4E.3 (Year: 2013).*
(Continued)

*Primary Examiner* — Daniel Petkovsek
(74) *Attorney, Agent, or Firm* — Caesar Rivise, PC

(57) ABSTRACT

A light pulse source and method for generating repetitive optical pulses are described. The light pulse source includes a continuous wave cw laser device, an optical waveguide optically coupled with the laser device, an optical microresonator, and a tuning device. The optical microresonator coupling cw laser light via the waveguide into the microresonator, which may include, a light field in a soliton state with soliton shaped pulses coupled out of the microresonator for providing the repetitive optical pulses. The laser device includes a chip based semiconductor laser, the microresonator and/or the waveguide may reflect an optical feedback portion of light back to the semiconductor laser, which may provide self-injection locking relative to a resonance frequency of the microresonator. The tuning device is arranged (Continued)

for tuning at least one of a driving current and a temperature of the semiconductor laser such that the microresonator may provide the soliton state.

23 Claims, 6 Drawing Sheets

(51) Int. Cl.
*H01S 5/00* (2006.01)
*H01S 5/065* (2006.01)
(52) U.S. Cl.
CPC .......... *H01S 5/0656* (2013.01); *G02F 1/3536* (2013.01); *G02F 2203/56* (2013.01)

(56) References Cited

U.S. PATENT DOCUMENTS

2018/0205463 A1    7/2018  Karpov et al.
2019/0312402 A1*  10/2019  Lucas .................... G02F 1/3536

OTHER PUBLICATIONS

K. Saha et al., "Modelocking and femtosecond pulse generation in chip-based frequency combs," Opt. Express vol. 21, No. 1, 2013, pp. 1335-1343 (Year: 2013).*
International Search Report for corresponding PCT Application No. PCT/EP2018/075020 dated Jun. 6, 2019.
Bogaerts et al., "Silicon Microring Resonators", Laser & Photonics, vol. 6, Issue 1, pp. 47-73 (2012).
Brasch et al., "Radiation Hardness of High-Q Silicon Nitride Microresonators for Space Compatible Integrated Optics", Optics Express, vol. 22, No. 25, pp. 30786-30794 (2014).
Brasch et al., "Photonic Chip-Based Optical Frequency Comb Using Soliton Cherenkov Radiation", Science, vol. 351, Issue 6271, pp. 357-360 (2016).
Brasch et al., "Bringing Short-Lived Dissipative Kerr Soliton States in Microresonators into a Steady State", Optics Express, vol. 24, No. 25 (2016).
Dahmani et al., "Frequency Stabilization of Semiconductor Lasers by Resonant Optical Feedback", Optics Letters, vol. 12, No. 11, pp. 876-878 (1987).
Del'Haye et al., "Optical Frequency Comb Generation From a Monolithic Microresonator", Nature, vol. 450, pp. 1214-1217(2007).
Del'Haye et al., "Frequency Comb Assisted Diode Laser Spectroscopy For Measurement of Microcavity Dispersion", Nature Photonics, vol. 3, pp. 529-533 (2009).
Fang et al., "Electrically Pumped Hybrid AlGaInAs-silicon Evanescent Laser", Optics Express, vol. 14, No. 20, pp. 9203-9210 (2006).
Gorodetsky et al., "Rayleigh Scattering in High-Q Microspheres", Journal of the Optical Society of America B, vol. 17, No. 6, pp. 1051-1057 (2000).
Green et al., "Ultra-Compact, Low RF Power, 10 Gb/s Silicon Mach-Zehnder Modulator", Optics Express, vol. 15, No. 25, p. 17106-17113 (2007).
Henry, C., "Theory of the Linewidth of Semiconductor Lasers", IEEE Journal of Quantum Electronics, vol. QE-18, No. 2, pp. 259-264 (1982).
Cundiff et al., "Colloquium: Femtosecond Optical Frequency Combs", Reviews of Modern Physics, vol. 75, pp. 325-342 (2003).
Herr et al., "Temporal Solitons in Optical Microresonators", Nature Photonics, vol. 8, pp. 145-152 (2014).
Ji et al., "Ultra-Low-Loss-On-Chip Resonators With Sub-Milliwatt Parametric Oscillation Threshold", Optca, vol. 4. No. 3, pp. 619-624 (2017).
Joshi et al., "Counter-Propagating Solitons in Microresonators", 2017 Conference on Laser and Electro-Optic (CLEO), The Optical Society, pp. 1-2 (2017).
Jost et al., "Counting the Cycles of Light Using a Self-Referenced Optical Microresonator", Optica, vol. 2, No. 8, pp. 706-711 (2015).
Karpov et al., "Universal Dynamics and Controlled Switching of Dissipative Kerr Solitons in Optical Microresonators", Jan. 20, 2016, Cornell University Library.
Kippenberg et al., "Modal Coupling in Traveling-Wave Resonators", Optics Letters, vol. 27, No. 19, pp. 1669-1671 (2002).
Kippenberg et al., "Microresonator-Based Optical Frequency Combs", Science, vol. 332, pp. 555-559 (2011).
Kondratiev et al., "Self-Injection Locking of a Laser Diode to a High-Q WGM Microresonator", Optics Express, vol. 25, No. 23, pp. 28167-28178 (2017).
Leo et al., "Temporal Cavity Solitons in One-Dimensional Kerr Media as Bits in an All-Optical Buffer", Nature Photonics, vol. 4, pp. 471-476 (2010).
Levy et al., "CMOS-Compatible Multiple-Wavelength Oscillator for On-Chip Optical Interconnects", Nature Photonics, vol. 4, pp. 37-40 (2010).
Liang et al., "High Spectral Purity Kerr Frequency Comb Radio Frequency Photonic Oscillator", Nature Communications, 6, 7957 (2015).
Liu et al., "Double Inverse Nanotapers for Efficient Light Coupling to Integrated Photonic Devices", Optics Letters, vol. 43, No. 14, pp. 3200-3203 (2018).
Liu et al., "Ultralow-Power Photonic Chip-Based Soliton Frequency Combs", 2018 International Conference on Optical MEMS and Nanophotonics (2018).
Liu et al., "Frequency-Comb-Assisted Broadband Precision Spectroscopy With Cascaded Diode Lasers", Optics Letters, vol. 41, No. 13 (2016).
Lucas et al., "Breathing Dissipative Solitons in Optical Mmicroresonators", Nature Communications, 8, 736 (2017).
Marin-Palomo et al., "Microresonator-Based Solitons for Massively Parallel Coherent Optical Communications", Nature Communications, vol. 546, pp. 274-281 (2017).
Obrzud et al., Temporal Solitons in Microresonators Driven by Optical Pulses, Nature Photonics, vol. 11, pp. 600-607 (2017).
Pfeiffer et al., "Photonic Damascene Process for Integrated High-Q Microresonator Based Nonlinear Photonics", Optica, vol. 3, No. 1 (2016).
Pfeiffer et al., "Octave-Spanning Dissipative Kerr Soliton Frequency Combs in Si3N4 Microresonators", Optica, vol. 4, No. 7 (Jul. 2017).
Pfeeifer et al., "Coupling Ideality of Integrated Planar High-Q Microresonators", Phys. Rev. Applied, 7, pp. 024026-1-024026-2 (2017).
Pfeiffer et al., "Probing the Loss Origins of Ultra-Smooth Si3N4 Integrated PhotonicWwaveguides", Laboratory of Photonics and Quantum Measurements (LPQM), Lausanne, CH-1015, Switzerland (2018).
Pfeieer et al., Photonic Damascene Process for Low-Loss, High-Confinement Silicon Nitride Waveguides, IEEE Journal of Selected Topics in Quantum Electronics, vol. 24, No. 4 (2018).
Spencer et al., "An Optical-Frequency Synthesizer Using Integrated Photonics", Nature, vol. 557 (2018).
Stephan, et al., "Laser Line Shape and Spectral Density of Frequency Noise", The American Physical Society, Physical Review A 71, p. 043809-1 (2005).
Stern et al., "Fully Integrated Ultra-Low Power Kerr Comb Generation", 2018.
Stone, et al., "Thermal and Nonlinear Dissipative-Soliton Dynamics in Kerr-Microresonator Frequency Combs", Physical Review Letters, 121(6), 2017.
Suh et al., "Microresonator Soliton Dual-Comb Spectroscopy", Science, vol. 359, pp. 884-887 (2018).
Suh et al., "Soliton Microcomb Range Measurement", Science, vol. 354, pp. 600-603 (2016).
Trocha et al., "Ultrafast Optical Ranging Using Microresonator Soliton Frequency Combs", Science, vol. 359, pp. 887-897 (2018).
Udem et al., "Optical Frequency Metrology", Nature, vol. 416, pp. 233-237 (2002).

(56) References Cited

OTHER PUBLICATIONS

Vassiliev et al., "Narrow-Line-Width Diode Laser With a High-Q Microsphere Resonator", Optics Communications, vol. 158, pp. 305-312 (1998).
Vlasov et al., "Silicon CMOS-Integrated Nano-Photonics for Computer and Data Communications Beyond 100G", IEEE Communications Magazine, pp. S67-S72 (2012).
Xuan et al., "High-Q Silicon Nitride Microresonators Exhibiting Low-Power Frequency Comb Initiation", Optica, vol. 3, No. 11 (2016).
Xue et al., "Mode-Locked Dark Pulse Kerr Combs in Normal-Dispersion Microresonators", Nature Photonics, vol. 9 (2015).
Yang et al., "Bridging Ultrahigh-Q Devices and Photonic Circuits", Nature Photonics, vol. 12, pp. 297-302 (2018).

\* cited by examiner

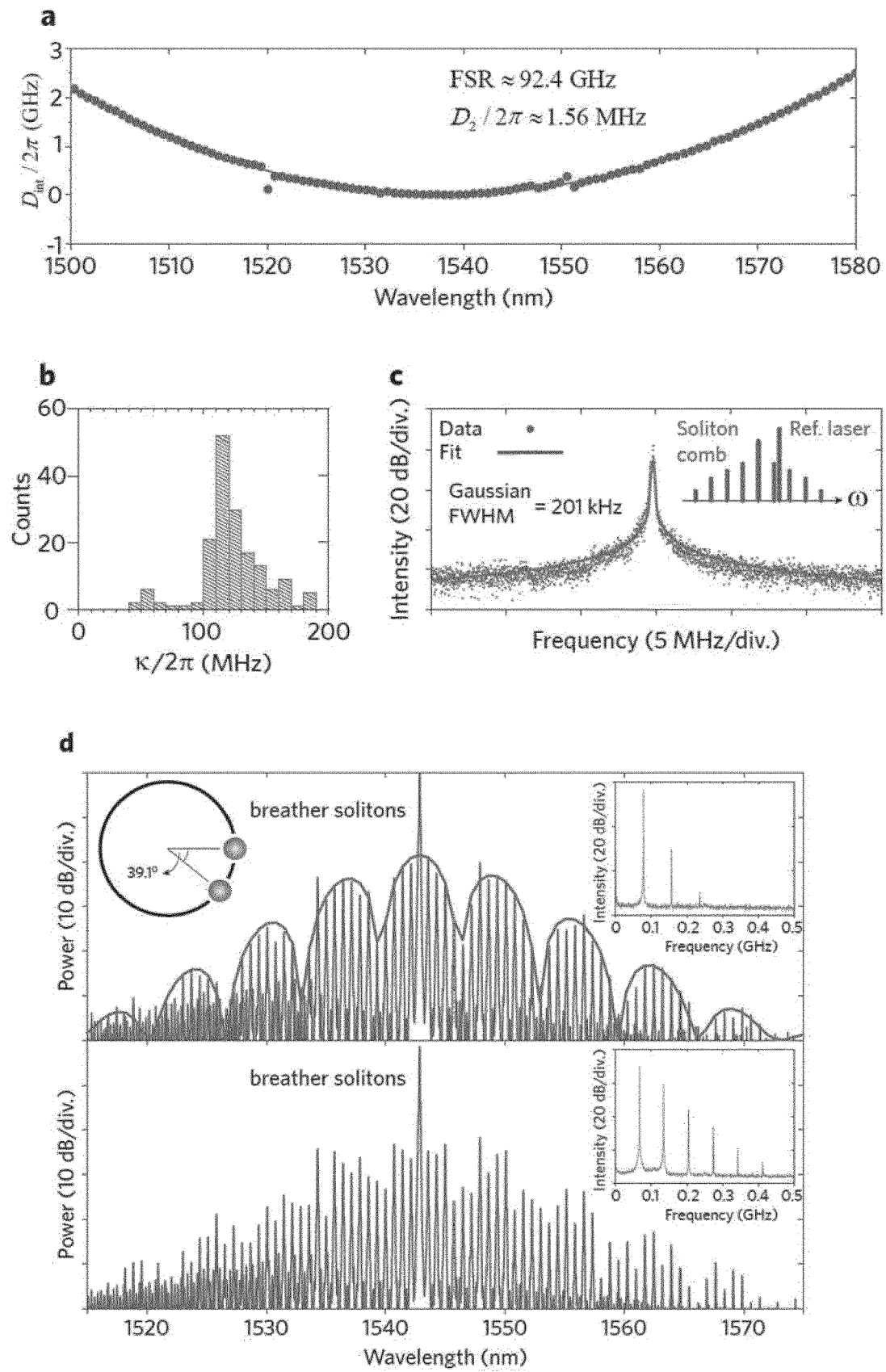
FIG. 8 (A – D)

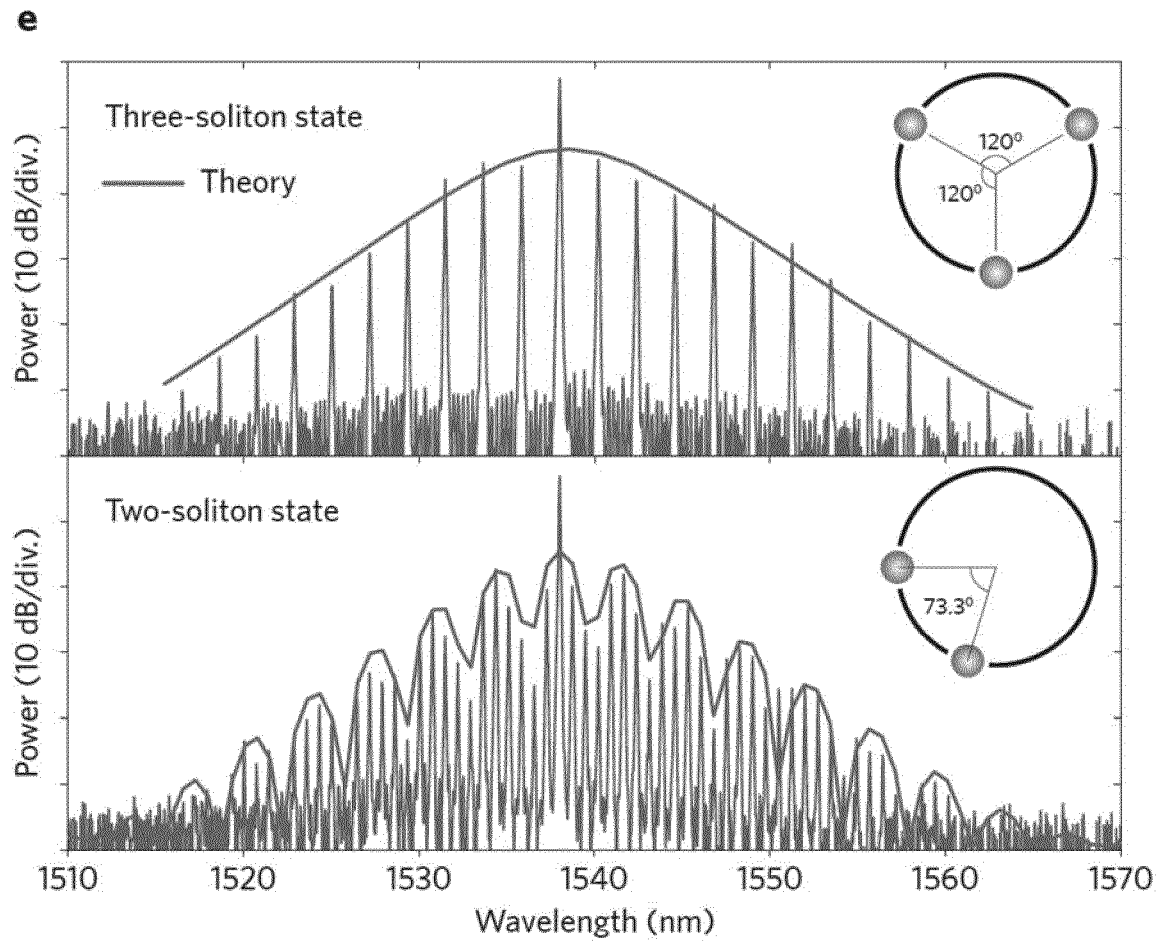
FIG. 8 (E – F)

GENERATING OPTICAL PULSES VIA A SOLITON STATE OF AN OPTICAL MICRORESONATOR COUPLED WITH A CHIP BASED SEMICONDUCTOR LASER

CROSS-REFERENCE TO RELATED APPLICATIONS

This application is a U.S. National Phase Application under 35 U.S.C. § 371 of PCT/EP2018/075020, filed Sep. 17, 2018, the contents of which are incorporated herein by reference in their entirety.

FIELD OF THE INVENTION

The present invention relates to a light pulse source, which is adapted for generating repetitive optical pulses using an optical microresonator which is made of a resonator material with a third order (Kerr) nonlinearity and an anomalous resonator dispersion. Furthermore, the present invention relates to a method of generating repetitive optical pulses with an optical microresonator. Applications of the invention are available e. g. in metrology, in particular with compact optical clocks, telecommunications, optical information processing, information transmission, astronomy, medical diagnostics and treatment and spectroscopy.

BACKGROUND OF THE INVENTION

In the present specification, reference is made to the following prior art illustrating technical background of the invention and related techniques:

[1] Udem, T. et al. Optical frequency metrology. Nature 416, 233 (2002);
[2] Cundiff, S. T. & Ye, J. Colloquium: Femtosecond optical frequency combs. Rev. Mod. Phys. 75, 325-342 (2003);
[3] Del'Haye, P. et al. Optical frequency comb generation from a monolithic microresonator. Nature 450, 1214 (2007);
[4] Kippenberg, T. J., Holzwarth, R. & Diddams, S. A. Microresonator-based optical frequency combs. Science 332, 555-559 (2011);
[5] Leo, F. et al. Temporal cavity solitons in one-dimensional Kerr media as bits in an all-optical buffer. Nature Photonics 4, 471-476 (2010);
[6] Herr, T. et al. Temporal solitons in optical microresonators. Nature Photonics 8, 145-152 (2014);
[7] Brasch, V. et al. Photonic chip-based optical frequency comb using soliton Cherenkov radiation. Science 351, 357-360 (2016);
[8] Jost, J. D. et al. Counting the cycles of light using a self-referenced optical microresonator. Optica 2, 706-711 (2015);
[9] Marin-Palomo, P. et al. Microresonator-based solitons for massively parallel coherent optical communications. Nature 546, 274 (2017);
[10] Trocha, P. et al. Ultrafast optical ranging using microresonator soliton frequency combs. Science 359, 887-891 (2018);
[11] Suh, M.-G. & Vahala, K. J. Soliton microcomb range measurement. Science 359, 884-887 (2018);
[12] Suh, M.-G., Yang, Q.-F., Yang, K. Y., Yi, X. & Vahala, K. J. Microresonator soliton dual-comb spectroscopy. Science 354, 600-603 (2016);
[13] Liang, W. et al. High spectral purity Kerr frequency comb radio frequency photonic oscillator. Nature Communications 6, 7957 (2015);
[14] Spencer, D. T. et al. An optical-frequency synthesizer using integrated photonics. Nature 557, 81-85 (2018);
[15] Fang, A. W. et al. Electrically pumped hybrid AlGaInAs-silicon evanescent laser. Optics Express 14, 9203-9210 (2006);
[16] Green, W. M. J., Rooks, M. J., Sekaric, L. & Vlasov, Y. A. Ultra-compact, low RF power, 10 Gb/s silicon Mach-Zehnder modulator. Optics Express 15, 17106-17113 (2007);
[17] Bogaerts, W. et al. Silicon microring resonators. Laser & Photonics Reviews 6, 47-73 (2012);
[18] Vlasov, Y. A. Silicon CMOS-integrated nano-photonics for computer and data communications beyond 100 g. IEEE Communications Magazine 50, s67s72 (2012);
[19] Stone, J. et al. Thermal and Nonlinear Dissipative-Soliton Dynamics in Kerr Microresonator Frequency Combs. arXiv:1708.08405 (2017);
[20] Brasch, V., Geiselmann, M., Pfeiffer, M. H. P. & Kippenberg, T. J. Bringing short-lived dissipative Kerr soliton states in microresonators into a steady state. Optics Express 24, 29312 (2016);
[21] Levy, J. S. et al. CMOS-compatible multiple-wavelength oscillator for on-chip optical interconnects. Nature Photonics 4, 37-40 (2010);
[22] Brasch, V., Chen, Q.-F., Schiller, S. & Kippenberg, T. J. Radiation hardness of high-Q silicon nitride microresonators for space compatible integrated optics. Optics express 22, 30786-30794 (2014);
[23] Yang, K. Y. et al. Bridging ultrahigh-q devices and photonic circuits. Nature Photonics 12, 297 (2018);
[24] Xuan, Y. et al. High-Q silicon nitride microresonators exhibiting low-power frequency comb initiation. Optica 3, 1171-1180 (2016);
Ji, X. et al. Ultra-low-loss on-chip resonators with sub-milliwatt parametric oscillation threshold. Optica 4, 619-624 (2017);
[26] Pfeiffer, M. H. P. et al. Probing the loss origins of ultra-smooth Si3N4 integrated photonic waveguides. arXiv:1802.08315 (2018);
[27] Liu, J. et al. Ultralow-power photonic chip-based soliton frequency combs. arXiv:1805.00069 (2018);
[28] Dahmani, B., Hollberg, L. & Drullinger, R. Frequency stabilization of semiconductor lasersby resonant optical feedback. Optics Letters 12, 876-878 (1987);
[29] Vassiliev, V. V. et al. Narrow-line-width diode laser with a high-Q microsphere resonator. Optics Communications 158, 305-312 (1998);
[30] WO 2014/131425 A1;
[31] Stern, B., Ji, X., Okawachi, Y., Gaeta, A. L. & Lipson, M. Fully integrated ultra-low power Kerr comb generation. arXiv:1804.00357 (2018);
[32] Kondratiev, N. M. et al. Self-injection locking of a laser diode to a high-Q WGM microresonator. Optics Express 25, 28167-28178 (2017);
[33] Henry, C. Theory of the linewidth of semiconductor lasers. IEEE Journal of Quantum Electronics 18, 259-264 (1982);
[34] Pfeiffer, M. H. P. et al. Octave-spanning dissipative kerr soliton frequency combs in si3n4 microresonators. Optica 4, 684-691 (2017);
[35] Lucas, E., Karpov, M., Guo, H., Gorodetsky, M. L. & Kippenberg, T. J. Breathing dissipative solitons in optical microresonators. Nature Communications 8, 736 (2017);
[36] Pfeiffer, M. H. P. et al. Photonic damascene process for integrated high-q microresonator based nonlinear photonics. Optica 3, 20-25 (2016);

[37] Pfeiffer, M. H. P. et al. Photonic Damascene Process for Low-Loss, High-Confinement Silicon Nitride Waveguides. IEEE Journal of Selected Topics in Quantum Electronics 24, 1-11 (2018);
[38] Liu, J. et al. Double inverse nanotapers for efficient light coupling to integrated photonic devices. Optics Letters 43, 3200-3203 (2018);
[39] Pfeiffer, M. H., Liu, J., Geiselmann, M. & Kippenberg, T. J. Coupling Ideality of Integrated Planar High-Q Microresonators. Physical Review Applied 7, 024026 (2017);
[40] Del'Haye, P., Arcizet, O., Gorodetsky, M. L., Holzwarth, R. & Kippenberg, T. J. Frequency-comb assisted diode laser spectroscopy for measurement of microcavity dispersion. Nature Photonics 3, 529-533 (2009);
[41] Liu, J. et al. Frequency-comb-assisted broadband precision spectroscopy with cascaded diode lasers. Opt. Lett. 41, 3134-3137 (2016);
[42] Gorodetsky, M. L., Pryamikov, A. D. & Ilchenko, V. S. Rayleigh scattering in high-Q microspheres. JOSA B 17, 1051-1057 (2000);
[43] Kippenberg, T. J., Spillane, S. M. & Vahala, K. J. Modal coupling in traveling-wave resonators. Opt. Lett. 27, 1669-1671 (2002); and
[44] Stephan, G. M., et al., Laser line shape and spectral density of frequency noise. Phys. Rev. A 71, 043809 (2005).

Laser frequency combs (or: optical combs) comprise optical devices creating sequences of repetitive laser pulses in time domain or spectra with a plurality of equidistant frequency components (frequency combs) in frequency domain. The term frequency comb is used for both of the device generating the pulses and the frequency spectrum in frequency domain. Optical combs [1, 2] have revolutionized time-keeping and frequency metrology over the past two decades, and have found a wide variety of applications. Microresonator-based Kerr optical combs (Kerr combs or micro-combs) [3, 4] have provided a route to compact chip-scale optical frequency combs, with broad optical bandwidth and repetition rates in the microwave to terahertz domain (10 GHz-1 THz). Their compact and low-power nature enable employment in mobile or airborne applications beyond research laboratories, including operation in space. The observation that such microcombs can be operated in the dissipative Kerr soliton (DKS) regime (soliton microcombs) [5-7], has allowed them to become fully coherent [6]. Kerr solitons exhibit a rich set of nonlinear optical phenomena such as soliton Cherenkov radiation (also known as dispersive waves) which can extend the spectral envelope of the frequency comb [7]. Soliton microcombs have been applied in counting of the cycles of light [8], coherent communication [9], ultrafast ranging [10, 11], dual comb spectroscopy [12], low-noise microwave generation [13] and optical frequency synthesis [14].

There is an interest in a full photonic integration of soliton microcombs in a single, compact, and electrically-driven package as this would reduce the costs of manufacturing the microcomb and in particular would allow mass manufacturable devices compatible with emerging high-volume applications such as e. g. laser-based ranging (LIDAR), or sources for dense wavelength division multiplexing for data center-based optical interconnects. However, as a limitation of the conventional techniques, microcombs rely on optical pumping by bulk external laser modules that provide the required coherence, frequency agility and power levels for soliton formation. Due to the high threshold power for soliton formation typically exceeding powers of integrated silicon based lasers, and the required frequency agility for soliton initiation, full photonic integration is challenging on the basis of the conventional techniques.

Via advances in silicon photonics, photonic integration has been achieved for lasers [15], modulators [16], and a wide range of passive and active elements [17, 18] which are already commercially available. Photonic integration of high-Q microresonators suitable for soliton formation has advanced significantly, in particular using $Si_3N_4$a CMOS-compatible material used as a capping layer. The platform possesses several advantageous properties [21], including a high Kerr nonlinearity, large flexibility for dispersion engineering, outer-space compatibility [22], and a large bandgap, thus free from two-photon absorption in the telecommunication band. All these advantages facilitate soliton formation in $Si_3N_4$microresonators [7]. In a related effort, ultrahigh-Q $SiO_2$ air-clad microresonators have recently been integrated with $Si_3N_4$waveguides for soliton generation [23]. Furthermore, high-Q $Si_3N_4$ photonic integrated microresonators (intrinsic $Q_0>1\times10^7$) have been fabricated [24-26].

Efforts to combine such integrated photonic microresonators with compact laser setups, such as those developed in silicon photonics, have recently been made [14]. Yet, these and other approaches (e. g. [30], [31]) are still optically pumped by off-chip lasers with stand-alone bulk laser modules, and typically employ additional amplifiers for soliton initiation to overcome coupling losses and low Q-factors (quality-factors) of integrated photonic resonators. Likewise, as mentioned above, the use of silicon photonics-based lasers is presently challenging due to the threshold of soliton formation that typically exceeds the laser's output power (mW scale).

Objective of the Invention

The objective of the invention is to provide an improved light pulse source, which is capable of avoiding limitations of conventional techniques for generating frequency combs with optical microresonators. In particular, the light pulse source is to be provided with a compact structure, a photonic integration capability and/or a facilitated control of tuning a laser driving the optical microresonator. It is a further objective of the invention to provide an improved method of generating repetitive optical pulses, wherein limitations of the conventional techniques are avoided and in particular photonic integration and/or driving control of the optical microresonator are improved.

SUMMARY OF THE INVENTION

These objectives are solved with a light pulse source and a method comprising the features of the independent claims, respectively. Advantageous embodiments and applications of the invention are defined in the dependent claims.

According to a first general aspect of the invention, the above objective is solved by a light pulse source for generating repetitive optical pulses, which comprises a continuous wave (cw) laser device (seed laser) for providing cw laser light, an optical microresonator and an optical waveguide (bus waveguide) being optically coupled with the cw laser device and the optical microresonator. The cw laser device and the optical microresonator are arranged on a common chip substrate device. The optical microresonator is made of a resonator material, which has a third order (Kerr) nonlinearity and an anomalous resonator dispersion. The cw laser device, the optical waveguide and the optical microresonator are configured such that when coupling the cw laser light via the optical waveguide into the optical microresonator, the optical microresonator includes an oscillating light field and, at a predetermined output frequency (or: emission wavelength) of the cw laser device, the optical microresonator is capable of including the light field in a soliton state. With this configuration, the light pulse source is capable of coupling soliton shaped pulses out of the optical microresonator for providing the repetitive optical pulses. For adjusting the output frequency, the light pulse source is provided with a tuning device controlling the cw laser device.

The optical microresonator is a compact, dielectric resonator having a cm- or sub-cm scale optical path length (i. e. optical path length equal to or below 2 cm, in particular below 10 mm), and micro-meter scale optical mode field diameter (e. g. optical mode field diameter equal to or below 2 μm). The microresonator may comprise a circular resonator, like a ring resonator or a whispering-gallery mode (WGM) resonator. In this case, the optical path length is the inner circumference length within the resonator times refractive index of resonator materials. Alternatively, the microresonator may comprise a linear resonator, like a Fabry-Perot resonator, with an optical path length equal to the longitudinal resonator length times refractive index of resonator materials.

According to the invention, the cw laser device comprises a chip based semiconductor laser. The semiconductor laser has a semiconductor material as laser-active section, in particular a semiconductor laser diode. The semiconductor laser is configured for direct electrical pumping. Preferably, it is adapted for creating the cw laser light in response to injecting a driving current to semiconductor material and particularly preferred without additional optical pumping. The term "chip based" refers to the arrangement of the semiconductor laser on a laser carrier chip, i. e. a solid carrier substrate, of the chip substrate device. Advantageously, all optical components of the cw laser device can be arranged on the laser carrier chip.

As an advantage of employing a chip based semiconductor laser, the light pulse source allows a photonic integration of the cw laser device and the optical microresonator. Thus, the light pulse source provides an electrically pumped microcomb with a compact structure.

Furthermore, according to the invention, at least one of the optical microresonator and the optical waveguide is adapted for reflecting an optical feedback portion of light (partial back reflection) back to the semiconductor laser. The semiconductor laser is configured for providing self injection locking relative to a resonance frequency of the optical microresonator by the effect of the optical feedback portion. Advantageously, the partial reflectivity of the optical microresonator and/or the optical waveguide improves a stable microcomb operation by stabilizing the cw laser light generation via self injection locking and narrowing the linewidth of the semiconductor laser. An amplitude of the optical feedback portion is selected such that the above effects of stabilizing the cw laser light generation and linewidth narrowing are obtained, e. g. based on test experiments and/or numerical simulations.

Furthermore, according to the invention, the tuning device is configured for tuning at least one of a driving current and a temperature of the semiconductor laser such that the optical microresonator is capable of providing the soliton state. The tuning device creates the driving current of the semiconductor laser and/or an electrical power input of a temperature control of the semiconductor laser for setting the soliton state of the light field oscillating in the microresonator, e. g. in dependency on prestored reference values, a prestored or controlled adjusting procedure and/or a loop control. Advantageously, the tuning device provides an electrical control, preferably an exclusively electrical current based control of the compact frequency comb.

According to a second general aspect of the invention, the above objective is solved by a light pulse generation method for generating repetitive optical pulses, comprising the steps of creating cw laser light with a cw laser device, optically coupling the cw laser light via an optical waveguide into an optical microresonator being made of a resonator material, which has a third order (Kerr) nonlinearity and an anomalous resonator dispersion, adjusting the output frequency of the cw laser device such that, at a predetermined output frequency of the cw laser device, the optical microresonator creates a light field in a soliton state, and coupling soliton shaped pulses out of the optical microresonator for providing the repetitive optical pulses.

According to the invention, the cw laser light is generated with a chip based semiconductor laser, an optical feedback portion of light is reflected from at least one of the optical microresonator and the optical waveguide back to the semiconductor laser, so that the semiconductor laser provides self injection locking relative to a resonance frequency of the optical microresonator, and the adjusting step includes tuning at least one of a driving current and a temperature of the semiconductor laser such that the optical microresonator creates the light field in the soliton state.

Preferably, the inventive light pulse generation method is implemented with the light pulse source according to the above first general aspect of the invention.

As a main advantage, the invention provides an electrically-driven and current-initiated, soliton microcomb significantly simplifying photonic integration. The inventors have found that photonic integration of soliton microcombs can be obtained in particular by the integration of nonlinear high-Q microresonators on a substrate, like a chip, and an on-chip solution for the seed laser with output power levels that are sufficient for soliton initiation, as well as any laser tuning mechanism [6, 7, 19, 20] used in the soliton excitation process. The output power of the semiconductor laser set for soliton excitation is selected in dependency on the Q (or: $Q_0$) factor of the microresonator and optionally also the operating frequency range. With preferred practical examples, the output power level of the semiconductor laser is at least 5 mW or at least 10 mW, in particular at least 100 mW. The output power even can be as high as 250 mW or more, like 300 to 400 mW, in particular depending on the operating frequency range 1.3 μm or 1.6 μm. Furthermore, preferably, the optical microresonator 30 has a high resonator quality $Q_0$, in particular with $Q_0 > 2 \times 10^6$, e. g. $Q_0 > 5 \times 10^6$, or particularly preferred $Q_0 > 1 \times 10^7$. The high-Q microresonator is obtained e. g. by manufacturing the microresonator with smooth waveguide sidewalls, as it is achieved e. g. by employing the photonic Damascene process including a reflow step [26].

Advantageously, the integrated device has a ca. 1 cm$^3$ volume or less, may use a commercially available semiconductor laser diode chip, preferably consumes less than 1 Watt of electrical power and produces optical frequency combs e. g. with sub 100 GHz line spacing. The invention offers a dramatic reduction in size, cost and weight, and also offers simplified heterogeneous integration, in particular as no wafer bonding is required unlike for silicon photonic III-V lasers. As a further advantage, the inventive technique is compatible with available semiconductor laser diode technology, and provides a path to scalable cost-effective manufacturing of micro-combs for high volume applications such as laser ranging or optical interconnects for datacenters feasible.

According to a preferred embodiment of the invention, the semiconductor laser has a linewidth in a range from 10 $cm^{-1}$ to 500 $cm^{-1}$. Advantageously, this facilitates accessing the multiple resonances of the microresonator, e. g. a microresonator with a repetition rate in the terahertz domain, e. g. 100 GHz.

As a further advantage, the invention can be implemented with different types of seed lasers. According to a first variant, the semiconductor laser comprises a single-mode laser diode. This embodiment of the invention has a particular advantage in terms of a reliable and deterministic access to a specific resonance around a central frequency of the laser diode (limited wavelength tuning), in particular in a 100 GHz or lower FSR microresonator. Preferably, the single-mode laser diode has a linewidth in a range from 100 kHz to 5 MHz (in particular, depending upon the quality on chip Bragg reflector, the linewidth varies). According to a second variant, the semiconductor laser comprises a multi-frequency laser diode. In this case, particular advantages in terms of tuning the seed laser are obtained.

According to a preferred embodiment of the invention, the common chip substrate device comprises an integral chip substrate, preferably made of a semiconductor, a ceramic or a solid dielectric, like glass, or a combination thereof. The integral chip substrate has a substrate surface on which both of the semiconductor laser and the optical microresonator as well as the waveguide are arranged. This embodiment of the invention has advantages in terms of stability of the light pulse source and operation thereof. Alternatively, the common chip substrate device comprises a hybrid chip substrate with a first chip carrying the semiconductor laser and a second chip carrying the optical microresonator, wherein the first and second chips are fixedly coupled to each other. With this embodiment, manufacturing the light pulse source is facilitated. The microresonator carrying chip can be made of a material different than the microresonator, e. g. silicon. Alternatively, it can be made of the same material like the optical microresonator.

If the tuning device of the light pulse source is arranged for implementing a predetermined adjusting procedure, efficiency of tuning of the semiconductor laser is improved. The adjusting procedure includes a first phase of setting a first operation condition of the semiconductor laser, wherein self injection locking between the semiconductor laser and the optical microresonator is obtained, and a subsequent second phase of setting a second operation condition of the semiconductor laser, wherein starting from the state of self injection locking, the soliton state of the light field in the optical microresonator is created. Setting the soliton state via the state of self injection locking accelerates the appropriate tuning of the light pulse source in an advantageous manner.

According to a further preferred embodiment of the invention, a sensor device can be arranged for detecting the first and second operation conditions of the semiconductor laser. Particularly preferred, the sensor device is arranged for monitoring an output power of the optical microresonator. An output signal of the sensor device can be used for providing a control loop including the tuning device.

Another particular advantage of the light pulse source results from the fact that the optical microresonator can be directly driven by the output of the semiconductor laser. Except of the waveguide having a light field guiding function, no additional optical components or effects are required between the semiconductor laser and the optical microresonator. In particular, the optical waveguide does not include a frequency filter section, so that the configuration of the light pulse source is facilitated in an advantageous manner.

If the tuning device is arranged for controlling the temperature of the semiconductor laser, preferably an electrically controlled heating element, such as a resistive heater, is provided as the tuning device for setting a temperature of a cw laser device. The heating element is thermally connected with a section of the chip substrate device carrying the semiconductor laser. Advantageously, the heating element facilitates the tuning of the output frequency of the cw laser light by setting the temperature of the laser-active section of the semiconductor laser.

Generally, the optical feedback portion of light reflected back to the semiconductor laser can be created by reflections occurring due to roughness, e. g. at an inner wall of the microresonator. However, according to a further advantageous embodiment of the invention, the optical feedback portion of light reflected back to the semiconductor laser can be created by a reflective structure provided in at least one of the optical microresonator and the optical waveguide at an output side of the optical microresonator. The reflective structure comprises e. g. at least one of a grating or an indentation structure created at the at least one of the optical microresonator and the optical waveguide. The provision of the reflective structure with a predetermined topography has advantages for mass manufacturing microcombs with reproducible features and/or reduced control requirements.

BRIEF DESCRIPTION OF THE DRAWINGS

Further details and advantages of the invention are described in the following with reference to the attached drawings, which schematically show in:

FIGS. 6 to 8: results of experimental tests and numerical simulations of the inventive creation of repetitive optical pulses.

DESCRIPTION OF THE PREFERRED EMBODIMENTS

Preferred embodiments of the invention are described in the following with particular reference to the structure of the inventive light pulse source and in particular the features of coupling a chip based semiconductor laser with the optical microresonator and operating a tuning device, which is used for achieving the soliton state of the optical microresonator. Exemplary reference is made to the use of one circular microresonator made of a $Si_3N_4$. It is emphasized that the invention is not restricted to this particular type of an optical microresonator, but rather possible with other resonators being made of e.g. $CaF_2$, $BaF_2$, SiN, AlN, $SiO_2$ or Si and/or having a linear resonator configuration, e. g. comprising a linear waveguide with corrugation at both ends, to form a Fabry Perot resonator. Furthermore, multiple light pulse sources of the invention can be combined, depending on the application of the invention, e. g. for simultaneous generation of multiple frequency combs with different spectral characteristics. Details of manufacturing the optical microresonator and waveguides as well as operating e.g. a cw laser or a monitoring device are not described as far as they are known per se from conventional techniques.

Light Pulse Source

Figure 1:
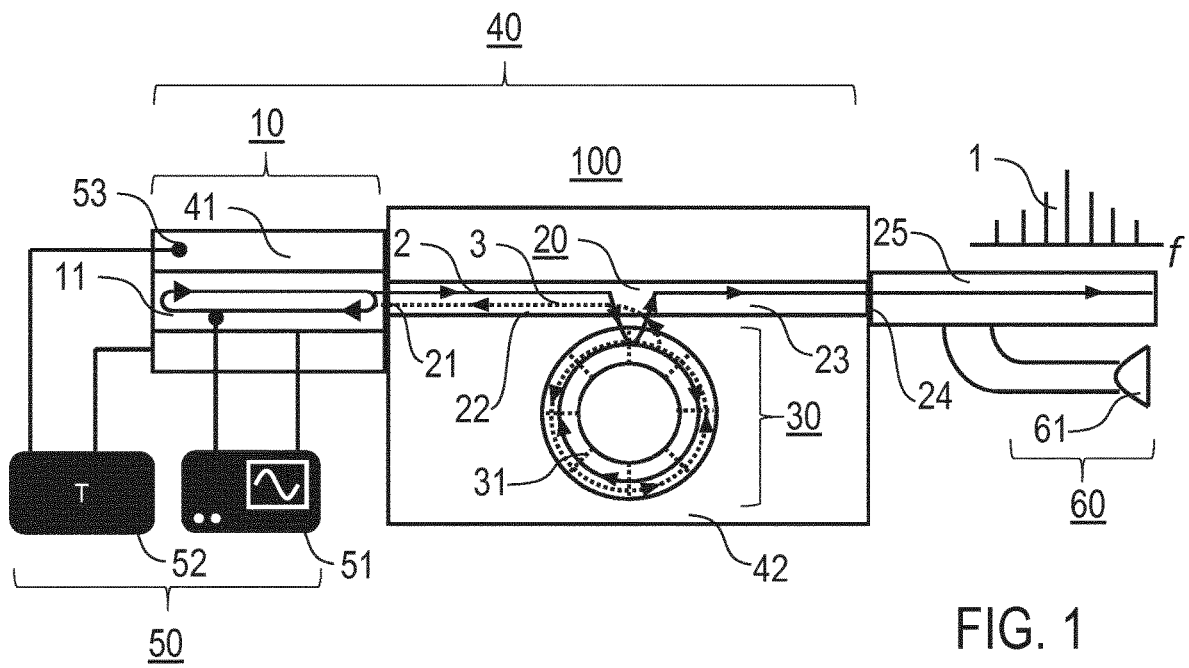
FIG. 1: features of preferred embodiments of a light pulse source according to the invention.

According to the schematic, enlarged illustration of FIG. 1, the light pulse source 100 comprises a cw laser device 10, an optical waveguide 20 being optically coupled with the cw laser device 10, and an optical microresonator 30 on a common chip substrate device 40. Furthermore, the light pulse source 100 comprises a tuning device 50 for adjusting the output frequency of the cw laser device 10 and optionally a sensor device 60 for monitoring an output of the light pulse source 100. The sensor device 60 comprises at least one photodiode 61. Due to the compact structure of combining the cw laser device 10 and the optical microresonator 30 on the common chip substrate device 40, the light pulse source 100 has a volume of less than about 1 ccm only.

The cw laser device 10 comprises a chip based semiconductor laser 11, in particular a multi-frequency Fabry-Perot-resonator based laser diode, like e. g. an Indium Phosphide (III-V) multiple longitudinal mode laser diode chip, creating cw laser light 2. The laser diode is e. g. an InGaAsP/InP multiple quantum well laser diode (manufacturer: SemiNex and Q-photonics). The semiconductor laser 11 has a laser carrier chip 41, which is a first section of the chip substrate device 40. The laser carrier chip 41 provides a carrier substrate and a heat sink. For tuning an output frequency of the semiconductor laser 11, the laser carrier chip 41 optionally includes a heating element 53, like a resistive heater, thermally coupled with the semiconductor laser 11 and electrically coupled with the tuning device 50.

The optical waveguide 20 is a linear waveguide with a first end 21 being optically coupled with the output of the semiconductor laser 11, e. g. by a direct contact of waveguide and laser facets. The optical waveguide 20 is made of e. g. $Si_3N_4$, AlN, or $SiO_2$, and it is arranged on a resonator carrier chip 42, which is a second section of the chip substrate device 40. The resonator carrier chip 42 is made of e. g. $Si_3N_4$. The optical waveguide 20 serves as both of an input waveguide (first waveguide section 22) carrying light fields of the cw laser light 2 to the optical microresonator 30 and an output waveguide (second waveguide section 23) carrying soliton shaped optical pulses 1 coupled out of the optical microresonator 30. The second waveguide section 22 can be coupled at a second end 24 of the optical waveguide 20 with another coupling waveguide 25 and/or the sensor device 60.

The optical microresonator 30 is made of a resonator material, which has a third order (Kerr) nonlinearity and an anomalous resonator dispersion, e. g. $Si_3N_4$. The optical microresonator 30 has a high resonator quality $Q_0$ with $Q_0 > 1 \times 10^7$. With an example, the optical microresonator 30 is a photonic chip-scale $Si_3N_4$ microresonator as described in [7]. The optical microresonator 30 is arranged on the resonator carrier chip 42, such that optical coupling with the optical waveguide 20 via evanescent light fields through a lateral waveguide surface is obtained.

The laser carrier chip 41 is made of InP, and it is directly butt-coupled to a resonator carrier chip 42 carrying the optical microresonator 30. The butt-coupling scheme (see also FIG. 4) gives an overall insertion loss of about 6 dB (diode-chip-lensed fiber), with a double inverse tapered structure for the light input/output coupling [38]. When the frequency of the light emitted from the semiconductor laser 11 coincides with a high-Q resonance of the optical microresonator 30, laser self-injection locking takes place as described below. This process (see also [29]) occurs due to reflecting an optical feedback portion 3 of light back to the semiconductor laser 11 (see dotted line in FIG. 1), which is obtained e. g. bulk and surface Rayleigh scattering in the optical microresonator 30 or reflective structures 31 within the optical microresonator 30 (see FIGS. 1, 2 and 4) or in the second waveguide section 23. The optical feedback portion 3 of light is injected back into the semiconductor laser 11, thus providing a frequency selective optical feedback to the semiconductor laser 11, leading to single-frequency operation and a significant reduction of the laser linewidth. The reflective structures 31 may comprise at least one grating and/or corrugation structure being adapted for a back reflection into specific mode of the semiconductor laser 11.

The tuning device 50 includes a driving current control 51 of the semiconductor laser 11 and/or a temperature control 52 connected with the heating element 53. The control units are configured for implementing the adjusting procedure such that the optical microresonator 30 is capable of providing the soliton state as described below. To this end, they can be connected with the sensor device 60.

Figure 2:
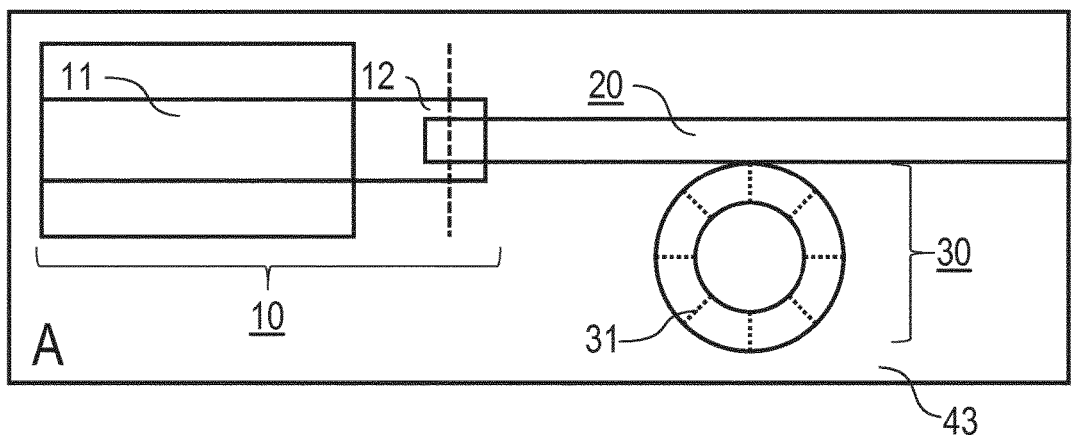
FIG. 2: variants of coupling a semiconductor laser via an optical waveguide or photonic wire bonding with an optical microresonator.
Figure 2:
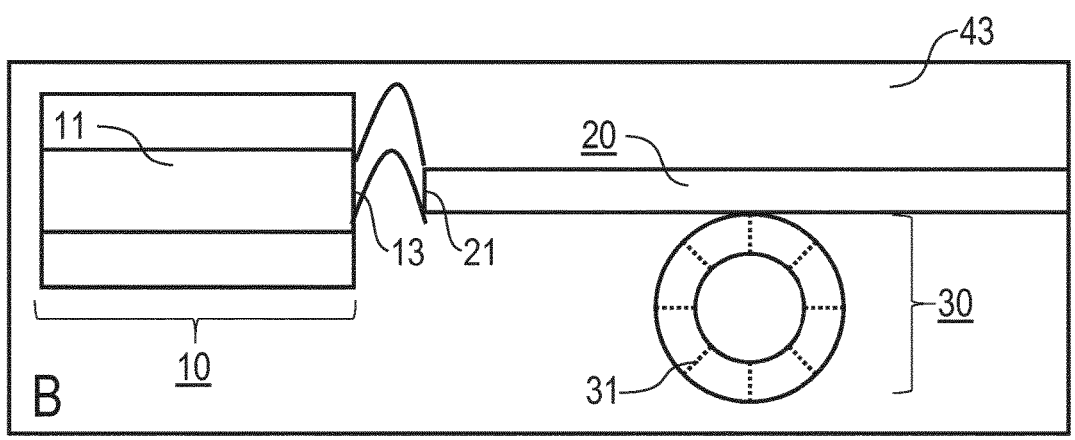

The semiconductor laser 11 and the optical microresonator 30 are arranged on the common chip substrate device 40 for coupling the cw laser light 2 via the optical waveguide 20 into the optical microresonator 30. The substrate device 40 may comprises the laser carrier chip 41 and the resonator carrier chip 42 (hybrid embodiment, e. g. FIG. 1) or a common single carrier chip 43 (e. g. FIG. 2).

FIG. 2 additionally shows variants of coupling the semiconductor laser 11 with the optical waveguide 20, including a heterogeneous integration (FIG. 2A) or a hybrid integration using photonic wire bonding coupling (FIG. 2B). With the heterogeneous integration, an output fibre 12 of the semiconductor laser 11 is optically coupled with the optical waveguide 20. For photonic wire bonding coupling, an optical fibre is arranged between the output facet 13 of the semiconductor laser 11 and the first end 21 of the optical waveguide 20. In both cases, the optical fibre can be a wave guiding section that is made of dielectric material e.g. SiN or $SiO_2$.

Figure 3:
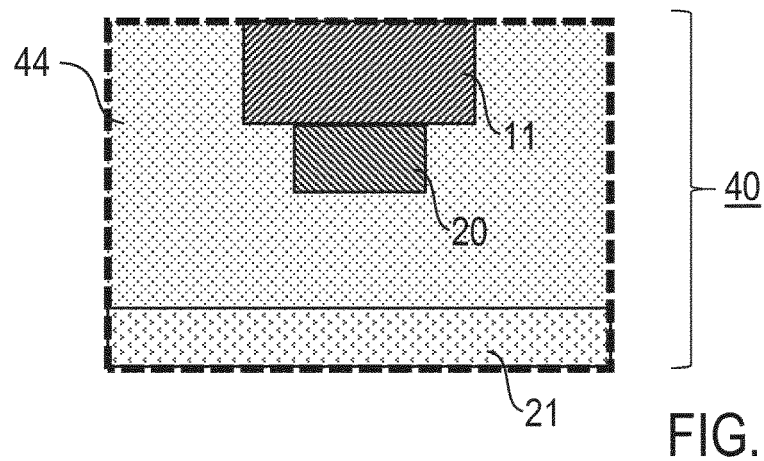
FIG. 3: vertically coupling a semiconductor laser output to an optical waveguide.

Another variant of coupling the semiconductor laser 11 with the optical waveguide 20 is shown with the cross-sectional view of a single chip substrate device 40 in FIG. 3. With this embodiment, a vertical coupling, i. e. coupling with a coupling direction deviating from the longitudinal resonator extension of the semiconductor laser 11, is provided. The semiconductor laser 11, e. g. the InP based laser diode, and the optical waveguide 20, made of e. g. $Si_3N_4$, are embedded in the common chip substrate device 40, made of e. g. a $SiO_2$ bulk 44 on a Si substrate 45. A lateral surface of the optical waveguide 20 is optically coupled with the semiconductor laser 11.

Figure 4:
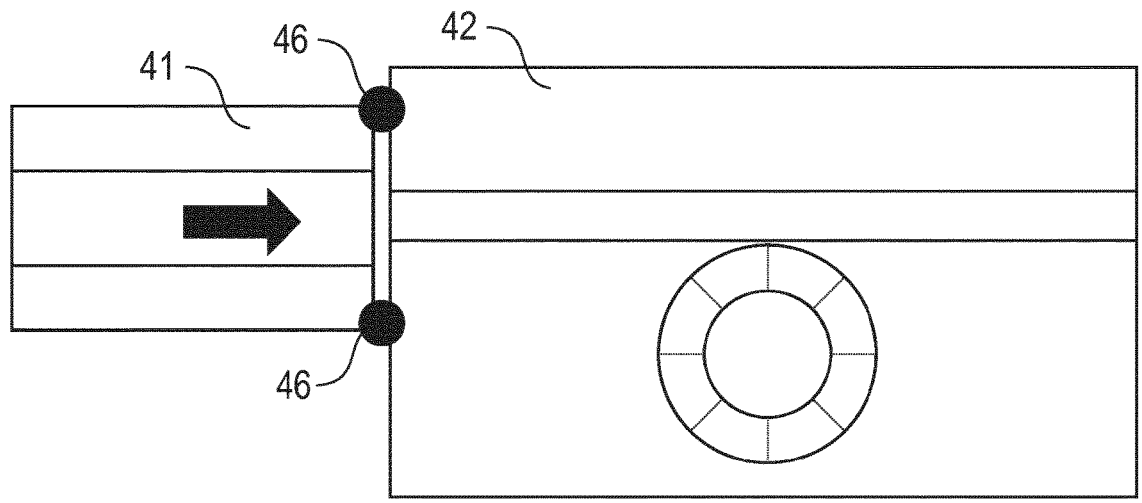
FIG. 4: an illustration of manufacturing a hybrid chip substrate embodiment of the invention.

For the hybrid embodiment, butt coupling can be obtained by gluing together the laser carrier chip 41 and the resonator carrier chip 42, as shown in FIG. 4. In practical manufacturing, drops 46 of an optically transparent glue, like an optical epoxy resin, are provided and the laser carrier chip 41 is pressed against the resonator carrier chip 43 (see arrow).

By using e. g. the high-Q photonic chip-scale $Si_3N_4$ microresonator 30, preferably manufactured using the photonic Damascene reflow process [26, 27] (see further details below), in conjunction with the multiple-longitudinal-mode (multi-frequency) Fabry-Perot InP laser diode chip, self-injection locking [28, 29] is observed in a regime where solitons are formed concurrently. Such self-injection locking with concurrent soliton formation has been demonstrated for bulk ultrahigh-Q crystalline MgF$_2$ resonators [13, 30]. The inventors observed that the current tuning of the laser diode induces transitions from the injection-locking-based single-longitudinal-mode lasing (×1000 fold reduction of linewidth), to Kerr frequency combs, breather soliton formation, followed by stable multiple and single DKS formation in the integrated microresonator. Heterodyne measurements (described below) demonstrate the low-noise nature of the generated soliton states. Such electrically-driven photonic chip-based soliton microcomb created according to the invention, provide a solution for integrated, unprecedentedly compact optical comb sources suitable for high volume applications.

Manufacturing the Light Pulse Source

The photonic integrated Si$_3$N$_4$ chip, including the optical microresonator 30 on the resonator carrier chip 42, is fabricated by using the photonic Damascene reflow process. Preferably, a plurality of chips are manufactured simultaneously. Waveguide and resonator patterns are defined by deep-UV stepper lithography and transferred to a SiO$_2$ preform via dry etching. A preform reflow step is used to reduce the waveguide sidewall roughness caused by dry etching [26, 36, 37], allowing for smooth waveguides and leading to high-Q factors for the microresonator. Chemical mechanical polishing (CMP) allows precise control of the waveguide height to 750±20 nm, measured over the full 4-inch (about 10 cm) wafer scale. No top cladding is deposited onto the Si$_3$N$_4$ waveguide. The precise dimension control by both the lithography (mainly in the waveguide width) and CMP (in the height) enables samples of the same design to have the identical geometry at different positions on the wafer.

The optical microresonator 30 is coupled to the optical waveguide 20 on the resonator carrier chip 42 through evanescent light fields. CW light 2 is coupled onto the Si$_3$N$_4$ chip via double inverse nanotapers [38] on the optical waveguides at both of the input and output facets, i.e. from the semiconductor laser 11 (laser diode chip) to the optical microresonator 30 (microresonator chip) and from the optical microresonator 30 to a lensed fiber which collects soliton shaped pulses 1 (the comb spectrum), as schematically shown in FIG. 2A. In addition, the optical waveguide's geometry is designed to achieve a high coupling ideality with reduced parasitic losses [39].

Microresonator Dispersion

The microresonator dispersion can be extracted by measuring the transmission spectrum, which is calibrated by a standard optical frequency comb [40, 41]. The dispersion of the optical microresonator 30 is represented in terms of resonant frequency deviation with respect to a linear grid, namely:

$$D_{int} = \omega_\mu - (\omega_0 + \mu D_1) = \sum_{m \geq 2} \frac{\mu^m D_m}{m!}$$

where $\omega_\mu$ are the physical resonant frequencies of the microresonator. A central resonance (to which the laser is injection locked) is given the index $\mu=0$. $D_1=2\pi \times FSR$ is the repetition frequency. The second order element $D_2$ is the group velocity dispersion (GVD) of the microresonator and $D_2 > 0$ represents the anomalous GVD.

Each resonance can be fitted using the model based on coupled mode theory [42, 43] from the transmission spectrum. The resonance linewidth reflects the total loss rate ($\kappa$) of the microresonator, which consists of both the intrinsic loss rate ($\kappa_0$) and the external coupling rate $\kappa_{ex}$, i.e. $\kappa=\kappa_0+\kappa_{ex}$. To extract the intrinsic Q-factor ($Q_0$), highly undercoupled microresonators are measured, i.e. $\kappa_{ex} \rightarrow 0$.

In practical implementations, three sets of optical microresonators 30 have been tested which differ in terms of FSRs: ~1 THz, ~150 GHz, and <100 GHz. The tests are described below with reference to FIGS. 6 to 8. The microresonator corresponding to results shown in FIG. 6 has: $Q_0 \approx 6 \times 10^6$, FSR=1.02 THz, $D_2/2\pi \approx 188$ MHz, for fundamental TE mode. The microresonator width is 1.53 µm. The microresonator corresponding to results shown in FIG. 7 has: $Q_0 \approx 6.5 \times 10^6$, FSR=149 GHz, $D_2/2\pi \approx 3.90$ MHz (fundamental TE mode), the microresonator width is 1.58 µm. The microresonators corresponding to results shown in FIG. 8 have: $Q_0 \approx 8.2 \times 10^6$, (for FIG. 4(d)) FSR=88.6 GHz, $D_2/2\pi \approx 1.10$ MHz (fundamental TE mode), the microresonator width is 1.58 µm; (for FIG. 8E) FSR=92.4 GHz, $D_2/2\pi \approx 1.56$ MHz (fundamental TE mode), the microresonator width is 1.58 µm.

Such high Q-factors have already enabled direct soliton comb generation in microresonators without amplification of the seed laser [27]. The threshold power for parametric oscillation can be as low as sub-milli-Watt (critical coupled), which is calculated as:

$$P_{th} = \frac{\kappa^2 n^2 V_{eff}}{4\omega c n_2}$$

where n is the refractive index, $V_{eff}$ indicates the effective modal volume, $\omega$ is the angular frequency of light, c the speed of light in vacuum, and $n_2$ is the nonlinear refractive index. For Si$_3$N$_4$ microresonators with FSR ~1 THz (n≈1.9, $V_{eff} \approx 1.5 \times 10^{-16}$ µm$^3$, and $n_2 \approx 2.4 \times 10^{-19}$ m$^2$/W). Hence, the threshold power is as low as $P_{th} \approx 0.62$ mW.

As an example, multiple DKS in the microresonator with FSR ~92.4 GHz are generated when applying a current of about 280 mA to the diode chip, corresponding to an optical output power of about 50 mW. The output power is measured as about 11 mW, collected by using a lensed fiber at the output chip facet 24, indicating a coupling efficiency of about 22% (overall insertion loss −6.6 dB). The optical power in the optical waveguide 20 is estimated to be about 23.5 mW, which has been demonstrated sufficient to excite DKS in high-Q Si$_3$N$_4$ microresonators [27].

Figure 5:
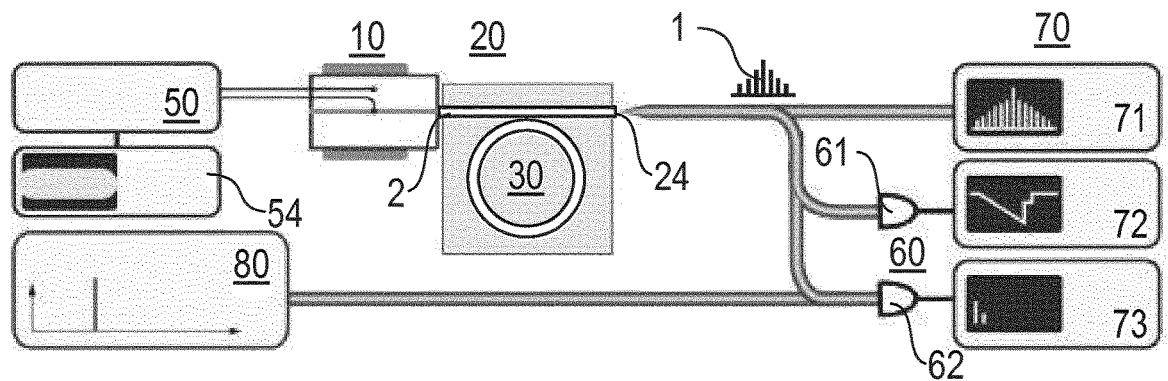
FIG. 5: further optional features of a light pulse source according to the invention.

Light Pulse Generation Method and Practical Characterization of the Light Pulse Source Features of the light pulse generation method and results of experimental tests, obtained with an embodiment of the light pulse source 100 as shown in FIG. 5 are described in the following with reference to FIGS. 6 to 8.

The light pulse source 100 of FIG. 5 comprises the cw laser device 10, the optical waveguide 20 and the optical microresonator 30 on the common chip substrate device 40, the tuning device 50 and the sensor device 60 with a first photodiode 61 as shown in FIG. 1. Furthermore, in particular for the tests of the source or for monitoring a source in operation, a monitoring device 70 is provided, including optical spectral analyzer 71, an oscilloscope 72 and/or an electrical-signal spectral analyzer 73. The optical spectral analyzer 71 is provided for characterizing the output pulses 1 in the optical domain, while the electrical-signal spectral analyzer 73 is provided for characterizing a beating signal by a heterodyne measurement of the output pulses 1 and the output of a reference laser 80, e. g. Toptica CTL1550, short-time linewidth of about 10 kHz, in the radio frequency (RF) domain. With the electrical-signal spectral analyzer 73, the coherence of the output pulses 2 can be monitored by employing a heterodyne beatnote measurement to a selected comb tooth with the narrow-linewidth reference laser 80. Furthermore, the tuning device 50 is connected with an arbitrary function generator 54 for setting adjustment procedures.

The heterodyne measurement is used to assess the coherence of the generated soliton shaped pulses 1, as its line shape reveals the frequency noise spectral density with respect to the reference laser 80. In fact, the frequency noise may consist of both the white noise (resulting in a Lorentzian line shape) and the flicker noise (corresponding to a Gaussian line shape). Therefore, the Voigt profile [44] can be employed to fit the beat signal, which represents the convolution of the Lorentzian (L(f)) and the Gaussian (G(f)) line shapes, i.e.:

$$G(f;\sigma) = \frac{\exp^{-f^2/2\sigma^2}}{\sigma\sqrt{2\pi}},$$

$$L(f;\psi) = \frac{\gamma}{\pi(f^2+\psi^2)}$$

$$V(f) = \int_{-\infty}^{+\infty} G(f';\sigma)L(f-f';\psi)df'$$

where f indicates the frequency shift with respect to the center of the beat signal, in the radio frequency domain, and σ and ψ scale the linewidth. To initiate the fitting it is assumed that, on the wings of the beat profile, the signal is mostly contributed by the white noise that determines the intantaneous linewidth described by ψ. In contrast, around the center of the beat profile, the signal is also contributed by flicker noise depending on e.g. the acquisition time of the ESA, as well as the stability of current or temperature controller. This part of noise is scaled by σ. The full width at half maximum (FWHM) of the Gaussian line shape is then $\Delta f_G=2\sigma$ and $\Delta f_L=2\psi$ for the Lorentzian.

Figure 6:
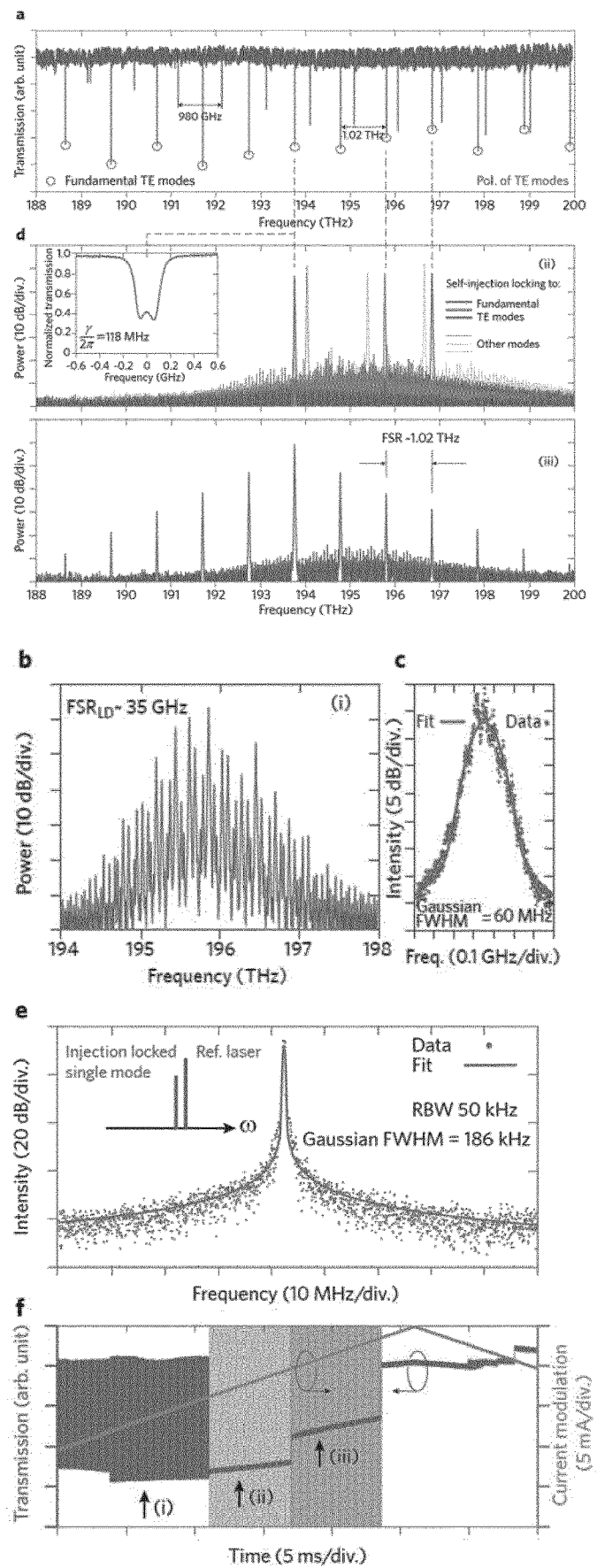
Figure 7:
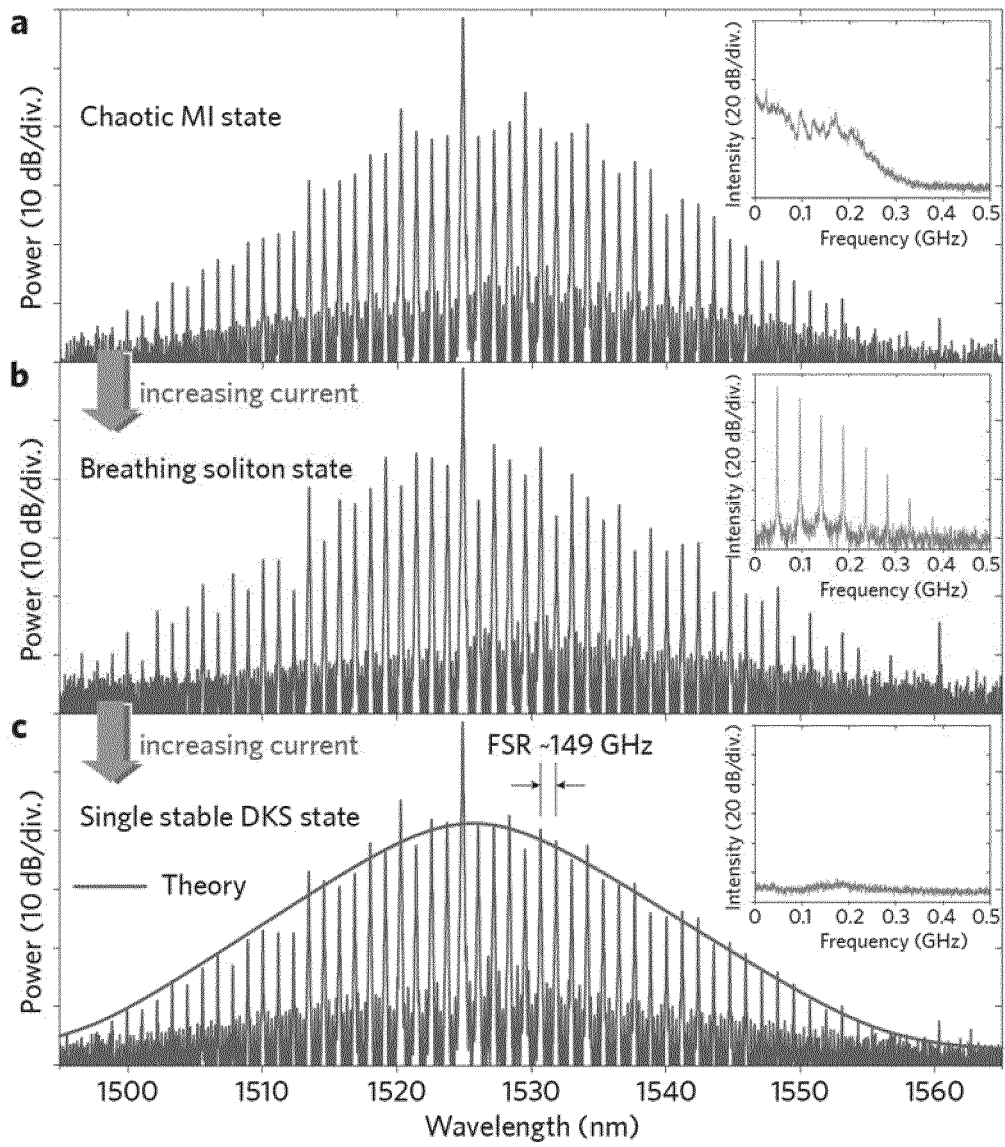

FIG. 6 illustrates the generation of an electrically pumped soliton microcomb via laser-injection-locked soliton formation. FIG. 6A shows a transmission spectrum of a $Si_3N_4$ microresonator 30 of 1.02 THz FSR (featuring two sets of resonances: the fundamental transverse electric (TE) mode family (marked by circles) and one high-order TE mode family). FIG. 6B shows the laser spectrum of the multi-frequency semiconductor laser 11, in particular laser diode, (corresponding to state i in FIG. 6F). FIG. 6C shows measured and fitted heterodyne beat signal between the free running semiconductor laser 11 and the narrow-linewidth reference laser 80 (showing 60 MHz linewidth). FIG. 6D shows in the top panel (state ii in FIG. 6F) spectra of single-longitudinal-mode that is injection-locked to a selected resonance of the microresonator, and in the bottom panel (state iii in FIG. 6F) the spectrum of the Kerr frequency comb that stems from the laser injection locking. The inset of FIG. 6D shows one resonance of the fundamental TE mode showing mode splitting due to backscattering, with the estimated 118 MHz coupling strength between the forward and backward propagating modes. FIG. 6E shows a heterodyne beat signal between the injection-locked semiconductor laser 11 and the reference laser 80. The measured beat signal is fitted with Voigt profile with full width at half maximum (FWHM) ~186 kHz (cf. details below).

FIG. 6F shows a typical transmitted power trace measured at the chip output facet 24, by current modulation imposed on the semiconductor laser 11, in which different states are marked: (i) Noisy, multi-frequency lasing without injection locking; (ii) Laser injection locking to a microresonator resonance, and simultaneous formation of low-noise single-longitudinal-mode lasing; (iii) formation of Kerr frequency comb. State (i) is a first phase of setting a first operation condition of the semiconductor laser, wherein the self injection locking between the semiconductor laser and the optical microresonator is obtained, while state (ii) is a second phase of setting a second operation condition of the semiconductor laser, wherein the soliton state of the light field in the optical microresonator is created.

An advantageous feature of the invention is to match the optical power requirement for soliton generation in the optical microresonator 30 to that of the semiconductor laser 11. This is achieved by employing the high-Q $Si_3N_4$ microresonator with high-Q factors ($Q_0 > 1\times10^7$) across the entire L band (see above). The Fabry-Perot laser diode of the semiconductor laser 11 is centered at 1530 nm, and its emission spectrum without self-injection locking is shown in FIG. 6B. The mode spacing is 35 GHz, determined by the Fabry-Perot cavity length. The overall maximum optical output power is about 100 mW when applying a current of about 350 mA to the laser diode. The electrical power consumed by the laser diode is less than 1 W. FIG. 6C shows the heterodyne beatnote of the free running laser diode mode with the reference laser 70, revealing both a Gaussian linewidth of 60 MHz and an estimated short-time linewidth of 2 MHz.

The inventors first studied self-injection locking of the semiconductor laser 11 to the photonic chip-based microresonator 30. This is achieved by tuning the current of the semiconductor laser 11, which not only changes the optical output power, but also shifts the lasing frequency via the carrier dispersion effect. Initially, the semiconductor laser 11 operates multi-frequency [FIG. 6B, a regime where none of the high-Q microresonator modes is frequency-matched with the multimode laser emission of the diode. By shifting the lasing frequency of the diode via current tuning, it is observed that the initially multi-frequency emission spectrum switches to single mode operation, indicative of self-injection locking. FIG. 6D demonstrates that the lasing frequency coincides with a selected resonance of the microresonator 30, and it is also observed that injection locking occurs for several resonances. All resonances, which give rise to the laser self-injection locking, feature mode splitting as a result of backscattering (cf. the inset in FIG. 6D). The backcoupling rate for the measured resonance, extracted from its mode-splitting profile, is $\gamma/2\pi=118$ MHz (see above). The presence of this back-coupling leads to an amplitude reflection coefficient (r) from the passive microresonator 30 on resonance:

$$r = \frac{2\eta\Gamma}{1+\Gamma^2}$$

where $\eta=\kappa_{ex}/\kappa$ characterizes coupling efficiency ($\kappa=\kappa_0+\kappa_{ex}$, with $\eta=\frac{1}{2}$ corresponding to critical coupling, and $\eta\approx1$ corresponding to strong overcoupling), and $\Gamma=\gamma/\kappa$ is the normalized mode coupling parameter that describes the visibility of the resonance split. According to [32], this reflection can initiate self-injection locking, and give rise to a narrow linewidth of:

$$\delta\omega \approx \delta\omega_{free} \frac{Q_{LD}^2}{Q^2} \frac{1}{16r^2(1+\alpha_g^2)}$$

where $Q=\omega/\kappa$ is the microresonator quality factor, $\omega/2\pi$ is the light frequency, $\delta\omega_{free}/2\pi$ is the linewidth of the free running laser. The phase-amplitude coupling factor $\alpha_g$ is the linewidth enhancement factor, given by the ratio of the variation of the real refractive index to the imaginary refractive index of the laser diode active region in response to a carrier density fluctuation [33] and takes typical values from 1.6 to 7.

The InGaAsP/InP multiple quantum well laser diode has $\alpha_g=2.5$. The laser diode quality factor $Q_{LD}$ can be estimated as $$Q_{LD} \approx \frac{\omega\tau_d R_o}{1-R_o^2},$$

where $R_o$ is the amplitude reflection coefficient of the output laser mirrors, and $\tau_d$ is the laser cavity round trip. The reflection coefficient is a parameter of the laser diode and is given by the laser diode manufacturer as $R_0=\sqrt{0.15}$ as well as $\alpha_g=2.5$. Other experimentally determined parameters are $\kappa/2\pi\approx110$ MHz, $\gamma/2\pi\approx118$ MHz, $\eta\approx0.64$, $\Gamma\approx1$, and $\tau_d=1/\text{FSR}_{diode}=1/(35\text{ GHz})=28.6$ ps. The theoretical estimation for the narrowed linewidth is $\delta\omega/2\pi\sim0.1$ kHz.

The inventors compared these theoretical estimates of the self-injection locked linewidth to experiments. The linewidth of the self-injection-locked single-longitudinal-mode laser is measured by the heterodyne measurement as shown in FIG. 6E. The line shape is fitted with a Voigt profile, which represents a convolution of Lorentzian and Gaussian line shape (see above, description of heterodyne detection), yielding a Gaussian contribution to the linewidth of 186 kHz. The estimated Lorentzian contribution amounts to 0.7 kHz, describing the wings of the measured beatnote. Self-injection locking leads to a narrowing of the white noise of the laser diode [32]. Therefore, this value should be compared with the Lorentzian contribution in the Voigt profile (i.e. 0.7 kHz) corresponding to a more than 1000-fold reduction in the linewidth.

Injection locking occurs also in the case where the laser cavity and microresonator are detuned from each other, and as outlined below, is preferred to generate dissipative Kerr solitons using self-injection locking. The locking range is defined as the frequency range over which the laser diode emission self-injection locks to the high-Q microresonator resonance and follows the expression [32]:

$$\Delta\omega_{lock} \approx r\sqrt{1+\alpha_g^2}\,\frac{\omega}{Q_{LD}}$$

The theoretically estimated locking range exceeds $\Delta\omega_{lock}/2\pi\approx30$ GHz.

To tune the self-injection-locked laser frequency into the regime where Kerr combs (and DKS) are formed, the inventors preferably use "injection pulling", which pulls the lasing frequency away from the high-Q resonance used for the self-injection locking. Injection pulling is a result of slight phase difference between the laser emission and its feedback, leading to imperfect locking [32]. Importantly, this effect is obtainable by tuning the current or temperature of the laser diode, allowing the laser frequency to be changed concurrently with the self-injection locking, providing thereby a frequency scan over the resonance, as used for DKS formation [6].

FIG. 6F shows the optical output power (transmission) trace as a function of the current tuning, where self-injection locking is deterministically observed. An initial chaotic power trace (state (i)) in FIG. 6F is switched to a step-like pattern (state (ii) in FIG. 6F, the centre marked region). The average output power reduces during the switching since the self-injection leads to single-longitudinal-mode operation, with enhanced power being coupled into the high-Q resonance of the $Si_3N_4$ microresonator 30. Most significantly, upon further tuning the current, a second step-like pattern in the power trace is observed (state (iii) in FIG. 6F, the right marked region), corresponding to the formation of a (low noise) Kerr frequency comb. Indeed, at high optical power levels (typically setting the current to be ~300 mA), Kerr comb generation was observed upon tuning the current, as shown in FIG. 6D. This phenomenon is supported by the high Q-factor of the microresonator 30, allowing sub-mW threshold power for parametric oscillations (see above).

The inventors have shown that self-injection locking can also be observed in devices with an electronically detectable mode spacing (149 GHz, and <100 GHz), and critically if it can also enable operation in a regime where DKS are formed concurrently. FIG. 7 shows the evolution of Kerr frequency comb in the regime of laser self-injection locking, from noisy state in the operation regime of modulation instability (FIG. 7A), via a so called breathing state (FIG. 7B), eventually to a low-noise state (FIG. 7C) showing the formation of a DKS in the microresonator, where the spectrum is a hyperbolic secant envelope (solid line showing the fitting of the spectral envelope). Each inset shows the low-frequency radio frequency (RF) spectrum corresponding to each state. The current imposed to the diode is initially set ~300 mA and the increase to evoke the transitions is within 1 mA. The $Si_3N_4$ microresonator in this measurement has an FSR of 149 GHz.

With further details, FIG. 7A shows the self-injection locked Kerr comb generation in the optical microresonator 30 with an FSR of 149 GHz. Significantly, not only were Kerr combs observed but also switching into the DKS regime [6]. Upon self-injection locking, and via current tuning, a Kerr comb is firstly excited in a low-coherence state, as evidenced by the noise in the low-frequency RF spectrum (inset in FIG. 7A). For such low repetition rates the amplitude noise is still a valid indicator of the frequency comb's coherence, in contrast to terahertz mode spacing resonators where the noise can be located at high RF frequencies (>1 GHz) [34]. Importantly, upon increasing the current to the diode further, which leads to a laser detuning increase by injection pulling, the low-coherence comb state is turned into an intermediate oscillatory state. That can be identified as a breather DKS (FIG. 7B) [35], where the soliton exhibits periodic oscillations. The RF spectrum shows the breathing frequency at ~490 MHz exhibiting harmonics, see inset in FIG. 7B. Such soliton breathing dynamics, i.e. breather DKS, have been studied previously [35], and in particular the breathing frequency depends on the laser detuning. The observation of a DKS breathing state demonstrates that the injection pulling enables operation in the effectively red detuned regime, required for soliton generation.

Further increasing the laser current, a transition to a low-noise comb state is observed, demonstrating the formation of stable DKS as shown in FIG. 7C. The spectral envelope of the frequency comb exhibits a secant-squared profile, corresponding to a single soliton circulating in the resonator, with the breathing oscillations absent from the RF spectrum (inset in FIG. 7C). This transition, which is induced here by current and/or temperature tuning only, has been achieved in previous work by tuning the laser over the resonance from the blue to the effectively red detuned side [6]. Most significantly, to corroborate operation in the soliton state, the coherence is verified via the heterodyne beatnote measurement [2]. The heterodyne beatnote of a soliton comb tooth with the reference laser 80 is shown in FIG. 8C. The measured heterodyne beatnote linewidth is comparable to that of the injection-locked laser FIG. 6D, i.e. the Gaussian linewidth is 201 kHz and the estimated short-time Lorentzian linewidth (that describes the wings of the beatnote only) is 1 kHz. These values indicate no degradation of the coherence during the process of soliton comb generation via laser self-injection locking.

Moreover, formation of soliton shaped pulses via laser self-injection locking was also observed in $Si_3N_4$ microresonators with FSRs below 100 GHz, an electronically detectable repetition rate, where due to the high Q-factors ($Q_0 \sim 8 \times 10^6$) enabled by the photonic Damascene reflow process, soliton combs could still be generated [27]. This is described in the following with reference to FIG. 8. FIG. 8A shows measured and fitted dispersion curves in a $Si_3N_4$ microresonator (cross-section 1.58×0.75 µm²), which has the FSR=92.4 GHz, and the second order dispersion element indicating the anomalous group velocity, $D_2/2\pi \approx 1.56$ MHz. FIG. 8B shows a histogram of resonance linewidths that are about 110 MHz, corresponding to a loaded Q-factor of about $1.8 \times 10^6$. FIG. 8C shows a heterodyne beat signal between the sideband of soliton Kerr frequency comb and the reference laser 80. The measured beat signal is fitted with the Voigt profile. FIGS. 8D and 8E illustrate multiple dissipative solitons formed in $Si_3N_4$ microresonators, in the breathing state (FIG. 8D) as well as in the low-noise stable soliton state (FIG. 8E), the fitting of the spectrum envelope (solid lines) further shows the relative position of solitons circulating in the microring cavity (schematic insets). The low-frequency RF spectra corresponding to breather solitons are also shown as insets. Spectra in FIGS. 8D and 8E are generated in $Si_3N_4$ microresonators with a free spectral range (FSR) of 88 GHz and 92 GHz, respectively.

With further details, the parabolic dispersion profile of FIG. 8A shows quadratic contribution from an anomalous group velocity dispersion (GVD) to be: $D_2/2\pi \approx 1.56$ MHz, centered at a wavelength ~1540 nm. The loaded resonance linewidth $\kappa/2\pi$ is ca. 110 MHz (FIG. 8B), corresponding to an over-coupled regime of the microresonator (the intrinsic loss rate is $\kappa_0/2\pi < 30$ MHz).

In these type of microresonators, multiple dissipative solitons are observed, shown in FIGS. 8D and 8E, not only in the breathing state but in the low-noise stable soliton state as well. The spectral envelope reveals a multi-soliton state as a result of interfering Fourier components of the solitons. By fitting these spectral envelopes (as outlined below), the number of solitons can be resolved and their relative positions can be estimated, illustrated as insets in FIGS. 8D and 8E. The overall transmitted optical power, consisting of both the comb power and the residual pump power, is measured ~11 mW (see above).

Dissipative Kerr soliton comb spectral fitting is provided on the basis of the following considerations. It is known that N identical solitons circulating in the resonator produce a spectral interference on the single soliton spectrum [6, 7]:

$$S^{(N)}(\mu) = S^{(1)}(\mu)\left(N + 2\sum_{j \neq l} \cos(\mu(\phi_j - \phi_l))\right)$$

Here $\varphi_i \in [0, 2\pi]$ is the position of the i-th pulse along the cavity roundtrip, µ is the comb mode index relative to the pump laser frequency and $S^{(1)}(\mu)$ is the spectral envelope of a single soliton following an approximate secant hyperbolic squared:

$$S^{(1)} \approx A \operatorname{sech}^2\left(\frac{\mu - \mu_c}{\Delta\mu}\right)$$

where A is the power of the comb lines near the pump and ∆µ is the spectral width of the comb (in unit of comb lines) and $\mu_c$ is the central mode of the soliton (to account for soliton recoil or self frequency shift). Knowing the comb repetition rate $f_r$, the spectral width (or pulse duration) can be retrieved: $\Delta f = f_r \Delta\mu$.

The spectral envelope of the single or multiple soliton states are fitted using the following procedure: First, the peaks $\tilde{S}(\mu)$ constituting the frequency comb are detected and labeled with their relative mode index from the pump µ, and the pump mode is rejected. The number of solitons N is estimated by taking the inverse Fourier transform of this spectrum, which yields the autocorrelation of the intracavity waveform, and detecting its peaks [7]. The set of fitting parameters $\{A, \Delta\mu, \mu_c, \varphi_i | i \in 2, N\}$ is defined accordingly (the position of one soliton is arbitraly set to zero) and the above expression for $S^{(N)}(\mu)$ is fitted to the experimental points $\tilde{S}(\mu)$. When N solitons are perfectly equi-spaced, the repetition is multiplied by N and the single soliton expression can be fitted on every N line.

The features of the invention disclosed in the above description, the drawings and the claims can be of significance both individually as well as in combination or subcombination for the realization of the invention in its various embodiments. The invention is not restricted to the preferred embodiments described above. Rather a plurality of variants and derivatives is possible which also use the inventive concept and therefore fall within the scope of protection. In addition, the invention also claims protection for the subject and features of the subclaims independently of the features and claims to which they refer.

The invention claimed is:

1. A light pulse source, being adapted for generating repetitive optical pulses, comprising:
   a continuous wave laser device being arranged for providing continuous wave laser light,
   an optical waveguide being optically coupled with the continuous wave laser device,
   an optical microresonator being made of a resonator material, which has a third order (Kerr) nonlinearity and an anomalous resonator dispersion, wherein the continuous wave laser device and the optical microresonator are arranged on a common chip substrate device for coupling the continuous wave laser light via the optical waveguide into the optical microresonator, which is configured to include, at a predetermined output frequency of the continuous wave laser device, a light field in a soliton state, so that soliton shaped pulses are coupled out of the optical microresonator for providing the repetitive optical pulses, and a tuning device being arranged for adjusting the output frequency of the continuous wave laser device, wherein the continuous wave laser device comprises a chip based semiconductor laser, at least one of the optical microresonator and the optical waveguide is adapted for back-reflecting an optical feedback portion of light to the semiconductor laser, which is configured for getting self injection locking relative to a resonance frequency of the optical microresonator by the effect of the optical feedback portion, and the tuning device is arranged for tuning at least one of a driving current and a temperature of the semiconductor laser such that the optical microresonator is configured for providing the soliton state.

2. The light pulse source according to claim 1, wherein the semiconductor laser has a linewidth in a range from 10 $cm^{-1}$ to 500 $cm^{-1}$.

3. The light pulse source according to claim 1, wherein the semiconductor laser comprises a single-mode laser diode.

4. The light pulse source according to claim 1, wherein the semiconductor laser comprises a multi-frequency laser diode.

5. The light pulse source according to claim 1, wherein the common chip substrate device comprises an integral chip substrate carrying both of the semiconductor laser and the optical microresonator.

6. The light pulse source according to claim 1, wherein the common chip substrate device comprises a hybrid chip substrate with a first chip carrying the semiconductor laser and a second chip carrying the optical microresonator, wherein the first and second chips are bonded to each other.

7. The light pulse source according to claim 1, wherein the tuning device is arranged for setting a first operation condition of the semiconductor laser, wherein self injection locking between the semiconductor laser and the optical microresonator is provided, and a second operation condition of the semiconductor laser, wherein the soliton state of the light field in the optical microresonator is provided.

8. The light pulse source according to claim 7, further comprising a sensor device being arranged for detecting the first and second operation conditions of the semiconductor laser.

9. The light pulse source according to claim 8, wherein the sensor device is arranged for monitoring an output power of the optical microresonator.

10. The light pulse source according to claim 1, wherein the optical waveguide does not include a frequency filter section.

11. The light pulse source according to claim 1, wherein the tuning device is arranged for controlling the temperature of the semiconductor laser, wherein the tuning device includes a heating element being arranged for setting a temperature of a continuous wave laser device carrying a section of the chip substrate device.

12. The light pulse source according to claim 1, wherein at least one of the optical microresonator and the optical waveguide at an output side of the optical microresonator includes a reflective structure being configured for reflecting the optical feedback portion of light back to the semiconductor laser.

13. The light pulse source according to claim 12, wherein the reflective structure comprises at least one of a grating or an indentation structure created at the at least one of the optical microresonator and the optical waveguide.

14. A light pulse generation method, which includes generating repetitive optical pulses, comprising the steps of:

creating continuous wave laser light with a continuous wave laser device, optically coupling the continuous wave laser light via an optical waveguide into an optical microresonator being made of a resonator material, which has a third order (Kerr) nonlinearity and an anomalous resonator dispersion, wherein the continuous wave laser device and the optical microresonator are arranged on a common chip substrate, adjusting the output frequency of the continuous wave laser device such that, at a predetermined output frequency of the continuous wave laser device, the optical microresonator creates a light field in a soliton state, and coupling soliton shaped pulses out of the optical microresonator for providing the repetitive optical pulses, wherein the continuous wave laser device comprises a chip based semiconductor laser, an optical feedback portion of light is back-reflected from at least one of the optical microresonator and the optical waveguide to the semiconductor laser, the semiconductor laser gets self injection locking relative to a resonance frequency of the optical microresonator by the effect of the optical feedback portion, and the adjusting step includes tuning at least one of a driving current and a temperature of the semiconductor laser such that the optical microresonator creates the light field in the soliton state.

15. The light pulse generation method according to claim 14, wherein the continuous wave laser light is created with a linewidth in a range from 10 $cm^{-1}$ to 500 $cm^{-1}$.

16. The light pulse generation method according to claim 14, wherein the continuous wave laser light comprises single-mode laser light.

17. The light pulse generation method according to claim 16, wherein the continuous wave laser light comprises single-mode laser light with a linewidth in a range from 100 kHz to 5 MHz.

18. The light pulse generation method according to claim 14, wherein the continuous wave laser light comprises multi-frequency laser light.

19. The light pulse generation method according to claim 14, wherein the adjusting step includes setting a first operation condition of the semiconductor laser, wherein self injection locking between the semiconductor laser and the optical microresonator is provided, and a second operation condition of the semiconductor laser, wherein the soliton state of the light field in the optical microresonator is provided.

20. The light pulse generation method according to claim 19, further comprising a step of
   detecting the first and second operation conditions of the semiconductor laser.

21. The light pulse generation method according to claim 20, wherein
   the detecting step includes monitoring an output power of the optical microresonator.

22. The light pulse generation method according to claim 14, wherein
   the step of optically coupling the continuous wave laser light via the optical waveguide into the optical microresonator does not include frequency filtering in a section of the optical waveguide.

23. The light pulse generation method according to claim 14, wherein
   the adjusting step includes controlling the temperature of the semiconductor laser by setting a temperature of a continuous wave laser device carrying section of the chip substrate device with a heating element.

* * * * *